United States Patent [19]

Marlor

[11] 4,053,309

[45] Oct. 11, 1977

[54] ELECTROPHOTOGRAPHIC IMAGING METHOD

[75] Inventor: Guy A. Marlor, Los Altos, Calif.

[73] Assignee: Varian Associates, Inc., Palo Alto, Calif.

[21] Appl. No.: 648,449

[22] Filed: Jan. 12, 1976

Related U.S. Application Data

[60] Continuation of Ser. No. 477,568, June 10, 1974, abandoned, which is a division of Ser. No. 272,241, July 17, 1972, which is a continuation of Ser. No. 149,821, June 3, 1971, which is a continuation of Ser. No. 721,331, April 15, 1968, abandoned.

[51] Int. Cl.[2] .......... G03G 5/12; G03G 5/04; H01L 31/08

[52] U.S. Cl. .......... 96/1 TE; 96/1.5 R; 338/15

[58] Field of Search .......... 96/1 TE, 1, 1.5; 338/15

[56] References Cited

U.S. PATENT DOCUMENTS

| | | | |
|---|---|---|---|
| 2,825,814 | 3/1958 | Walkup | 96/1 TE |
| 2,930,999 | 3/1960 | Van Santen et al. | 96/1.5 |
| 2,937,353 | 5/1960 | Wasserman | 338/15 |
| 3,121,006 | 2/1964 | Middleton et al. | 96/1.5 |
| 3,151,982 | 10/1964 | Corrsin | 96/1 R |
| 3,248,261 | 4/1966 | Narken et al. | 96/1.5 |
| 3,288,603 | 11/1966 | Corrsin | 96/1.5 |
| 3,510,298 | 5/1970 | Lane | 96/1.5 |
| 3,653,890 | 4/1972 | Seimiga et al. | 96/1 |

FOREIGN PATENT DOCUMENTS

| | | | |
|---|---|---|---|
| 1,517,118 | 2/1968 | France | 96/1.5 |
| 291,000 | 4/1963 | Netherlands | 96/1.5 |
| 897,992 | 6/1963 | United Kingdom | 96/1 |
| 950,593 | 2/1964 | United Kingdom | 96/1.5 |
| 1,049,872 | 1/1966 | United Kingdom | 96/1.5 |
| 1,079,065 | 8/1967 | United Kingdom | 96/1.5 |

OTHER PUBLICATIONS

Schaffert, R. M., Transfer of Electrostatic Images to Dielectric Surface, Photo. Sci. and Engin., vol. 9, No. 1, 1/65, pp. 40–53.

*Primary Examiner*—David Klein
*Assistant Examiner*—L. Falasco
*Attorney, Agent, or Firm*—Stanley Z. Cole; Leon F. Herbert; Edward J. Radlo

[57] ABSTRACT

An electrophotographic camera is disclosed. The camera employs a novel photoconductive plate, the composition of which is disclosed together with the method of making same. In the camera, a photo image to be recorded is focused thrugh an optically transparent substrate and transparent electrode onto the back surface of a photoconductive layer. The charge-retentive surface of an electrographic recording paper is disposed adjacent the photoconductive layer and the conductive backing of the paper is connected to an electrode for impressing a charge transfer potential across the photoconductor layer and the charge-retentive layer of the paper. When the potential is impressed across the photoconductor, electrons liberated in the photoconductor by the photon image to be recorded are transferred to the charge-retentive surface of the recording paper to form a charge image of the object to be recorded. The charge image is subsequently developed by applying charged toner particles to the image for developing same. The photoconductive layer comprises a substantially continuous layer of electrically interconnected crystals of active photoconductive material coated and bound together with a lead sealing glass interstitially disposed of the electrically interconnected crystals. The resultant photoconductive layer has improved strength and resistance to abrasion while producing acceptable photographic images. The photoconductive layer is produced by heating a stratum including particles of lead sealing glass together with particles of photoconductive material in the presence of a molten solvent and proportions of one or more activators.

8 Claims, 3 Drawing Figures

ELECTROPHOTOGRAPHIC IMAGING METHOD

This is a continuation of Ser. No. 477,568 filed June 10, 1974, now abandoned, which is a division of application Ser. No. 272,241 filed July 17, 1972, which is a continuation of application Ser. No. 149,821 filed June 3, 1971, which is a continuation of Ser. No. 721,331 filed Apr. 15, 1968 now abandoned.

DESCRIPTION OF THE PRIOR ART

Heretofore, photoconductive layers have been produced by forming a stratum including particles of a material selected from the group consisting of sulphides, selenides and sulphoselenides of cadmium, recrystallizing said material in a molten solvent to a desired range of particle sizes, incorporating into said recrystallized material activator proportions of a halide and activator proportions of a metal selected from a group consisting of copper and silver, and evaporating the molten solvent. The resultant layer is a substantially continuous layer of electrically interconnected crystals of photoconductive material. Such a sintered photoconductive material is described in U.S. Pat. No. 2,765,385, issued Oct. 2, 1956.

The problem with this prior art photoconductive material is that it is relatively fragile and non-resistant to abrasion, thereby precluding its use as a camera plate in an electrographic camera. The abrasion of the photoconductive surface in such an application would produce surface scratches and transfer of the photoconductive layer to the electrophotographic recording paper, thereby rendering the photoconductive camera plate unuseable.

Others have constructed xerographic plates of copper and chlorine-doped cadmium sulphide photoconductive powder incorporated in an acrylic resin consisting of n-butyl and isobutyl methacrylate. The acrylic resin served as a binder for the photoconductive particles and comprised approximately 11% by weight of the layer. The layer was formed by mixing the photoconductive powder and the acrylic resin in xylene to form a slurry. The slurry was applied to a tin oxide coated borosilicate glass substrate and air-dried and further dried at 80° C for several hours. The resultant photoconductive layer had improved mechanical stability over the aforementioned photoconductive layer but was found to have greatly reduced ASA speed, as of 1/100th of that of the aforedescribed prior art plate. Such a photoconductive plate is described in an article titled "Photoinduced Discharge Characteristics of Cadmium Sulphide Binder Layers in the Xerographic Mode" appearing in the Journal of Applied Physics, Vol. 36, No. 11, of November, 1965, pp 3475-3480. The problem with using such a photoconductor as an electrographic camera plate is that it produces rather speckled images due to a lack of uniformity of the resultant layer, it has a relatively high dark background current, and is sensitive to the presence of moisture which tends to alter its photoconductive properties and to give rise to excessive dark conductivity. In addition, this latter type of photoconductive plate suffers from memory effects, thereby precluding its use in a camera wherein the time interval between successive picture frames is desired to be as short as possible.

Therefore, the need exists for an improved photoconductive plate which will have relatively high ASA speeds, will be mechanically strong and resistant to abrasion, and which will be highly homogeneous and free of surface blemish and defects while providing relatively little memory and having very low dark current.

SUMMARY OF THE PRESENT INVENTION

The principal object of the present invention is the provision of an improved photoconductive layer and method of making same.

One feature of the present invention is the provision of a sintered photoconductor comprising a layer of electrically interconnected photoconductive crystals of a substance selected from the group consisting of sulphides, selenides, tellurides and sulphoselenides of a member of the group consisting of zinc and cadmium, and containing activator proportions of a member of the group consisting of halides, copper and silver, and incorporating a glass binder interstitially disposed of said polycrystalline crystals, whereby a mechanically stable abrasion-resistant, high-speed photoconductive layer is formed having low memory and low dark current characteristics.

Another feature of the present invention is the same as the preceding feature wherein the photoconductive crystals comprise crystals of cadmium sulphide containing activator proportions of chloride and copper and wherein the glass binder is a lead sealing glass.

Another feature of the present invention is the same as any one or more of the preceding features wherein the photoconductive layer is produced by a method including the steps of, forming a layer including particles of glass mixed together with particles of a substance selected from the group consisting of sulphides, tellurides, selenides and sulphoselenides of a member of the group consisting of zinc and cadmium, recrystallizing at least portions of said substance in said layer in a molten solvent incorporating the activator, and melting the glass particles which are interstitially disposed of the activated photoconductive substance.

Another feature of the present invention is the same as the preceding feature wherein the glass particles have a softening temperature between 50° and 250° below the temperature at which the mixed particles are heated for melting the solvent.

Other features and advantages of the present invention will become apparent upon a perusal of the following specification taken in connection with the accompanying drawings wherein:

DESCRIPTION OF THE PREFERRED EMBODIMENTS

Figure 1:
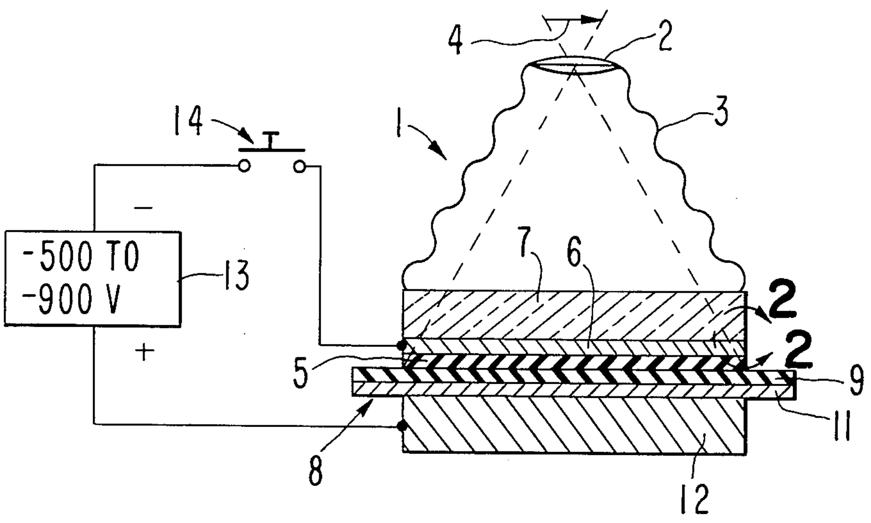
FIG. 1 is a schematic line diagram, partly in section and partly in block diagram form, depicting an electrophotographic camera incorporating features of the present invention.

Referring now to FIG. 1, there is shown an electrophotographic camera 1 incorporating features of the present invention. The camera 1 includes a lens 2 disposed at one end of a dark box 3 for focusing the light obtained from an object 4 onto the back side of a photoconductive layer 5 disposed at the image plane of the lens 2. The photoconductive layer 5, as of 20 to 100 microns, is deposited over an optically transparent conductive electrode 6 which in turn is supported from an optically transparent substrate 7, as of borosilicate glass plate one-fourth inch thick. A suitable transparent conductive electrode structure 6 comprises a tin oxide coating having a resistivity of 50 ohms per square and having a transparency, in the optical range, greater than 95%. Other suitable conductive electrodes 6 include metal films of chromium and gold.

An electrographic recording paper 8 is disposed adjacent the photoconductive layer 5 with the charge-retentive surface 9 of the paper 8 disposed adjacent the photoconductive layer 5. The conductive layer 11 of the paper 8 is disposed facing a conductive electrode structure 12 for uniformly pressing the charge-retentive surface 9 of the paper 8 into nominal contact with the surface of the photoconductor 5. A source of potential, as of −500 to −900 volts, is connected across electrodes 6 and 12 via the intermediary of a timing switch 14. An electrographic camera 1 of the type herein disclosed is described and claimed in copending U.S. application Ser. No. 599,069 filed Dec. 5, 1966 and assigned to the same assignee as the present invention now U.S. Pat. No. 3,502,408.

In operation, the image of the object 4 to be photographed is focused upon the photoconductive layer 5. The timing switch 14 is closed for the appropriate exposure time determined by the available light intensity and the speed of the photoconductive layer 5. During the exposure time, electrons liberated within the photoconductive layer 5 by the incident light image are caused to be transferred through the photoconductive layer 5 into the charge-retentive surface 9 of the electrographic paper 8. In this manner, a charge image of the object 4 is produced in the charge-retentive surface 9 of the paper. The charge image is then developed by removing the paper 8 from the camera 1 and applying positively charged toner particles to the charge image for developing same. The toner particles may be suspended in air or in a liquid dielectric vehicle. Alternatively, the polarity of the source 13 may be reversed to produce positive charge images on the charge retentive surface 9.

The photoconductor 5 is also sensitive to invisible radiation; i.e., photon of energy outside the visible range of wavelengths. For example, the photoconductor is useful for photographing X-ray, X-ray or neutron images. In such latter applications, the transparent electrode 6 and substrate 7 need only be transparent to the rays which are to form the image on the photoconductor 5.

Figure 2:
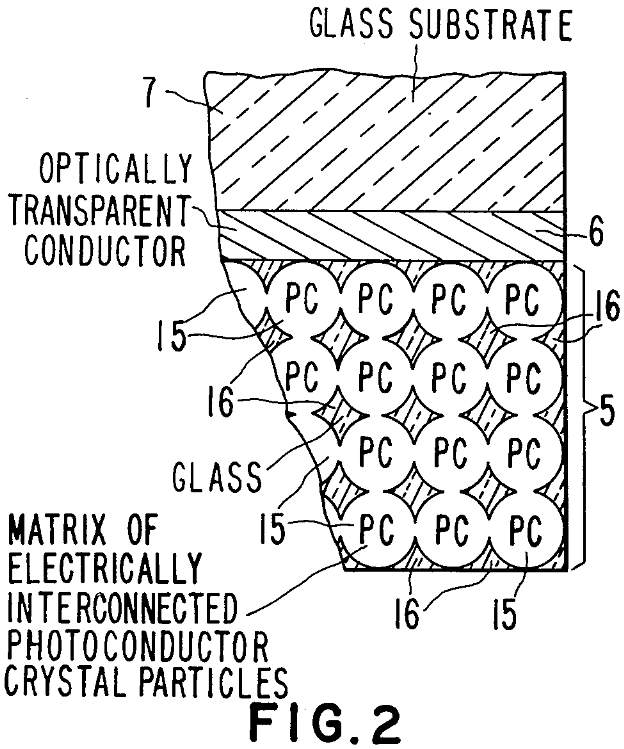
FIG. 2 is an enlarged view of a portion of the structure of FIG. 1 delineated by line 2—2.

Referring now to FIG. 2, there is shown the structural detail of the photoconductive layer 5 of the present invention. The photoconductive layer 5 comprises a substantially continuous polycrystalline layer of electrically interconnected photoconductive crystals 15 of a photoconductive substance selected from the group consisting of sulphides, tellurides, selenides, and sulphoselenides of a member of the group consisting of zinc and cadmium and containing activator proportions of a member of the group consisting of halides, copper and silver. A lead sealing glass binder material 16 is interstitially disposed of the polycrystalline layer 15, thereby binding the crystals together to make the layer mechanically stable and resistant to abrasion. Each of the photoconductive crystallites of the layer 15 is fused to its neighboring photoconductive crystallites by means of a recrystallized bridge or junction therebetween, thereby producing low resistance electrical bridging connections between neighboring photoconductive crystallites of the photoconductive layer 5.

The surface of the photoconductive layer 5 which faces the charge-retentive surface 9 of the paper 8 is relatively smooth, having a surface ripple less than 5 microns. The surface ripple is defined as the vertical distance between adjacent peaks and valleys in the surface of the photoconductor. Although the glass binder 16 completely coats the surface of the photoconductive particles 15 at the exposed surface of the photoconductive layer 5, the thickness of the glass is only on the order of a micron or less and does not interfere with proper operation of the photoconductive layer 5. Photoconductive layers 5 produced in accordance with the teachings of the present invention are found to be resistant to abrasion, and to be mechanically strong for producing electrographic images of acceptable photographic quality; i.e., defects cannot be discerned by the unaided eye.

Figure 3:
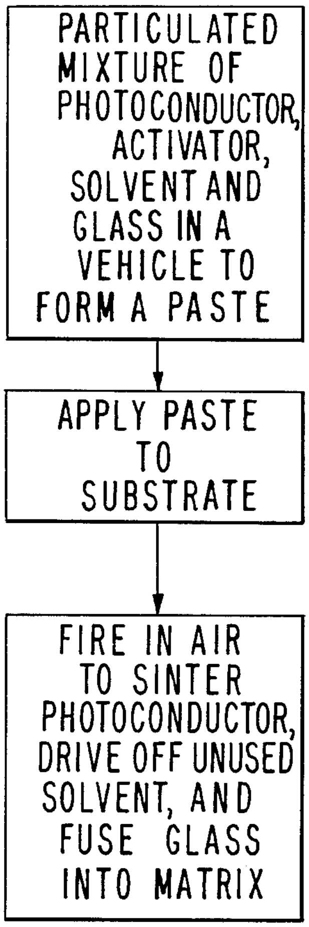
FIG. 3 is a flow diagram, in block diagram form, depicting the method of the present invention for fabricating the photoconductive layer of the present invention.

Referring now to FIG. 3, there is shown a flow diagram, in block diagram form, depicting the method for fabricating photoconductive layers 5 according to the present invention. Briefly, the method for producing the photoconductive layer 5 comprises the steps of, mixing together the powdered photoconductor and powdered lead sealing glass in the presence of suitable photoconductor activators and photoconductive solvent or fusing agent. The powdered glass, photoconductor, activator and fusing agent are dispersed in a suitable vehicle to form a paste and applied by a doctor blade or by spraying or by painting onto the transparent conductive electrode layer 6 as carried upon the glass substrate 7. The substrate containing the coating is then placed in an air furnace and sintered at 600° C for approximately 15 minutes. The resultant sintered photoconductive layer is then allowed to cool to room temperature. A conductor is then painted onto the side edge of the substrate member to make contact with the optically transparent conductive electrode 6 and the photoconductive plate is then ready for use.

Suitable photoconductive materials include sulphides, tellurides, selenides and sulphoselenides of zinc or cadmium. Suitable activator elements include the halides, copper, and silver. Suitable solvents for the photoconductor include halides of cadmium or zinc. Suitable vehicles for the powdered mixture include ethyl alcohol and xylene. Suitable glasses include the lead sealing glasses having a softening temperature between 50° and 250° C below the temperature at which the mixed particles are heated for melting the solvent. The glass particles preferably comprise between 10% and 45% by weight of the particulated photoconductive substance exclusive of the glass particles. In a preferred embodiment, the sealing glass has a softening point of approximately 150° C below the temperature at which the particulated layer is fired in the furnace.

In a specific example of a method for forming the photoconductive layer 5 of the present invention, an intimate mixture is formed of 75 grams of cadmium sulphide, 22.5 grams of powdered sealing glass, 0.075 grams of $Cu\,Cl_2 \cdot 2H_2O$ and 11.25 g of dry $Cd\,Cl_2 \cdot 2.5H_2O$. A suitable cadmium sulphide powder is high purity powder obtained from Gallard Schlesingler Chemical Company of Carle Place, N.Y., Batch No. B7649. A suitable powdered sealing glass is No. 7570 of Corning Glass Works, Corning, N.Y., having a powder size corresponding to 325 mesh. The $Cu Cl_2 . 2H_2O$ is preferably added from a 15 ml solution of 0.005 g/ml of ethyl alcohol. Cadmium chloride is preferably prepared by heating the cadmium chloride at a temperature in excess of 100° C in a 50 ml glass beaker for 30 minutes and then adding ethyl alcohol until a smooth paste is obtained. Approximately 25 ml of ethyl alcohol will result in a smooth paste.

The cadmium sulphide, lead sealing glass, copper chloride and cadmium chloride are then all mixed together in 130 ml of ethyl alcohol plus 130 ml of xylene. 25 cylindrical milling balls are added in a 16-oz. glass jar and the mixture is ball-milled for 48 hours to produce a smooth paste. The smooth paste is then applied to a thickness of approximately 20 to 100 microns thick as by a doctor blade or by spraying over the transparent conductive coating 6 on a Corning 7760 borosilicate glass plate having a thickness of approximately 0.250 inch. The coated glass plate is then placed in a furnace operating in air at 600° C for 15 minutes and then allowed to cool to room temperature. The resultant photoconductive layer is then ready for use. For spraying, a water suspension comprising 130 ml of water is substituted for the xylene and then the cadmium chloride need not be introduced in paste form.

During the firing step, the cadmium chloride melts, dissolving the copper salt and some of the cadmium sulphide. In the molten solution, ion exchange chemical reaction takes place in the presence of the inert molten glass. In these chemical reactions, copper activates the photoconductive cadmium sulphide material. In addition, an ion exchange reaction occurs wherein chlorine ions enter the cadmium sulphide lattice to produce further activation of the photoconductive material. Also the cadmium chloride acts as a fusing agent for producing conductive bridging connections between the adjacent crystallite particles of the photoconductive material.

On further heating, the cadmium sulphide recrystallizes at the junctions between adjacent cadmium sulphide crystals and the unused cadmium chloride evaporates. The recrystallized cadmium sulphide has incorporated therein activator proportions of copper and chlorine. When substantially all of the unused cadmium chloride has evaporated, the cadmium sulphide crystals are electrically interconnected with one another, forming a substantially continuous polycrystalline layer of electrically interconnected photoconducting crystals on the glass plate. The resultant layer is extremely homogeneous and firmly adherent to the glass.

The lead sealing glass has a softening temperature of approximately 150° lower than the firing temperature of 600°. The sealing glass is inert to the ion exchange and chemical reactions occurring between the copper and the cadmium chloride and cadmium sulphide. The glass particles, upon melting, form a coating around the chemically reacted particles and provides a binder filling the interstitial spaces between the electrically interconnected crystallites of the photoconductive layer. The glass imparts mechanical strength and abrasion-resistant characteristics to the resultant photoconductive layer 5. The binder glass is electrically inert as contrasted with prior organic binders which have served to reduce the quantum conversion efficiency of photoconductive plates.

In place of cadmium sulphide, sulphides, tellurides, selenides and sulphoselenides of zinc or cadmium may be used. Cadmium sulphide and its equivalents will hereinafter be referred to as the host crystal.

Cadmium chloride is introduced into the mixture to act as a solvent for the host crystal. In addition to cadmium chloride, other halides of cadmium or zinc may be used such as, for example, bromides or iodides of cadmium or zinc may be employed. Instead of copper, silver may be introduced into the host crystal as the activator. The proportion of glass by weight of the host crystal preferably falls within the range of 10% to 45% with 30% being especially desirable.

Since many changes could be made in the above construction and many apparently widely different embodiments of this invention could be made without departing from the scope thereof, it is intended that all matter contained in the above description or shown in the accompanying drawings shall be interpreted as illustrative and not in a limiting sense.

What is claimed is:

1. In a repetitive imaging method for reproducing on the charge-retentive surface of a recording medium a charge pattern reproduction of an image to be copied, the method comprising the steps of:

providing a reusable electrophotographic plate comprising a photoconductive layer including inorganic glass binder and inorganic photoconductive particles formed over a conductive substrate, the glass binder in the photoconductive layer comprising between 10% and 45% by weight of the photoconductive layer exclusive of the glass binder;

placing the charge-retentive surface closely adjacent to the photoconductive layer; and exposing the electrophotographic plate to the image to be copied with a d.c. voltage applied across the plate and recording medium to cause a brief and relatively transient flow of electrons within the plate and to form an electrostatic charge image on the charge-retentive surface conforming in configuration to the image being copied, said charge image being developable into a visible image.

2. The imaging method of claim 1 wherein the photoconductive particles are cadmium sulphide or cadmium sulphoselenide, and containing activator proportions of a halide and activator proportions of a metal selected from the group consisting of copper and silver.

3. The imaging method of claim 2 wherein the photoconductive particles are cadmium sulphide and the activator is chloride and copper.

4. The imaging method of claim 1 wherein the glass comprises 30% by weight of the photoconductive layer exclusive of the glass.

5. The imaging method of claim 1 wherein the glass is lead sealing glass.

6. The imaging method of claim 1 wherein the photoconductive layer includes activator proportions of a halide and of a metal selected from the group consisting of copper and silver.

7. An imaging method for reproducing on the charge-retentive surface of a recording medium a visible reproduction of an image to be copied, the method comprising the steps of:

providing an electrophotographic plate comprising a photoconductive layer including inorganic glass binder and inorganic photoconductor particles formed over a conductive substrate, the glass binder in the photoconductive layer comprising between 10% and 45% by weight of the photoconductive layer exclusive of the glass binder;

placing the charge-retentive surface closely adjacent to the photoconductive layer;

exposing the electrophotographic plate to the image to be copied with a d.c. voltage applied across the plate and recording medium to cause a brief and relatively transient flow of electrons within the plate and to form an electrostatic charge image on the charge-retentive surface;

and developing the charge image on the charge-retentive surface to provide the visible reproduction of the image to be copied.

8. Method as in claim 7 wherein said developing step includes the application to the charge retentive surface of toner particles having a polarity opposite to that of the electrostatic charge image previously deposited on said charge retentive surface.

* * * * *